United States Patent
Morita et al.

(10) Patent No.: US 9,514,977 B2
(45) Date of Patent: Dec. 6, 2016

(54) SEMICONDUCTOR DEVICE AND MANUFACTURING METHOD THEREOF

(71) Applicant: KABUSHIKI KAISHA TOSHIBA, Minato-ku (JP)

(72) Inventors: Toshiyuki Morita, Yokkaichi (JP);
Seiichi Omoto, Yokkaichi (JP);
Kazuaki Nakajima, Yokkaichi (JP);
Hiroshi Toyoda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/200,636

(22) Filed: Mar. 7, 2014

(65) Prior Publication Data
US 2015/0171003 A1    Jun. 18, 2015

Related U.S. Application Data

(60) Provisional application No. 61/917,210, filed on Dec. 17, 2013.

(51) Int. Cl.
| | |
|---|---|
| *H01L 21/768* | (2006.01) |
| *H01L 23/532* | (2006.01) |
| *H01L 27/115* | (2006.01) |
| *H01L 21/288* | (2006.01) |

(52) U.S. Cl.
CPC .......... *H01L 21/768* (2013.01); *H01L 21/288* (2013.01); *H01L 21/76834* (2013.01); *H01L 21/76847* (2013.01); *H01L 21/76877* (2013.01); *H01L 21/76879* (2013.01); *H01L 21/76885* (2013.01); *H01L 23/53228* (2013.01); *H01L 23/53242* (2013.01); *H01L 23/53257* (2013.01); *H01L 27/11531* (2013.01); *H01L 2924/0002* (2013.01)

(58) Field of Classification Search
CPC .......... H01L 2924/0002; H01L 2924/00; H01L 23/53238; H01L 21/76831; H01L 21/76873; H01L 2224/48227; H01L 2224/32225; H01L 2224/97; H01L 2924/00014
See application file for complete search history.

(56) References Cited

U.S. PATENT DOCUMENTS

| | | |
|---|---|---|
| 6,319,741 B1 | 11/2001 | Izumi et al. |
| 7,323,410 B2 | 1/2008 | Standaert et al. |

(Continued)

FOREIGN PATENT DOCUMENTS

| | | |
|---|---|---|
| JP | 3086762 B2 | 9/2000 |
| JP | 2001-94238 A | 4/2001 |

(Continued)

*Primary Examiner* — Tony Tran
(74) *Attorney, Agent, or Firm* — Oblon, McClelland, Maier & Neustadt, L.L.P.

(57) ABSTRACT

A semiconductor device according to the present embodiment includes a first wiring part located above a substrate and made of a first metal material. A second wiring part is provided as being superimposed on the first wiring part and having a width substantially equal to that of the first wiring part. A first resistivity of the first wiring part is lower than a second resistivity of the second wiring part when the first and second wiring parts have a first width. The second resistivity is lower than the first resistivity when the first and second wiring parts have a second width larger than the first width. The semiconductor device includes both of an area in which the first and second wiring parts have the first width and an area in which the first and second wiring parts have the second width.

9 Claims, 19 Drawing Sheets

(56) References Cited

U.S. PATENT DOCUMENTS

| | | |
|---|---|---|
| 7,645,700 B2 | 1/2010 | Standaert et al. |
| 8,384,060 B2 | 2/2013 | Ryoo et al. |
| 2007/0032055 A1 | 2/2007 | Standaert et al. |
| 2007/0236641 A1 | 10/2007 | Ning et al. |
| 2008/0088027 A1 | 4/2008 | Standaert et al. |
| 2009/0230376 A1 | 9/2009 | Ryoo et al. |
| 2014/0353829 A1* | 12/2014 | Ochimizu et al. ............ 257/751 |

FOREIGN PATENT DOCUMENTS

| | | |
|---|---|---|
| JP | 2007-281459 A | 10/2007 |
| JP | 2009-218597 A | 9/2009 |
| JP | 4742147 B2 | 8/2011 |
| JP | 2013-197533 A | 9/2013 |

\* cited by examiner

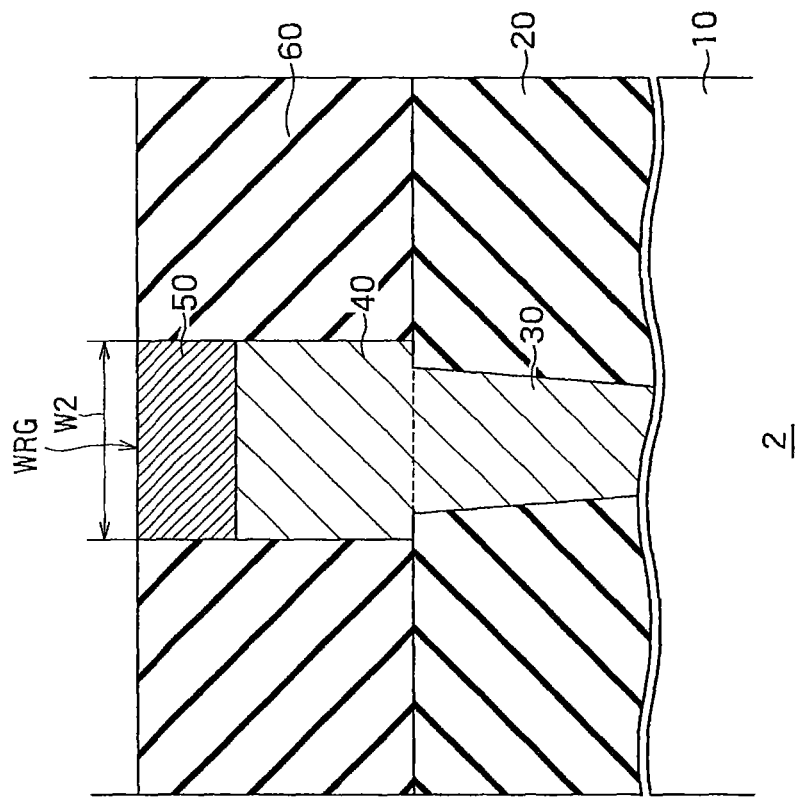
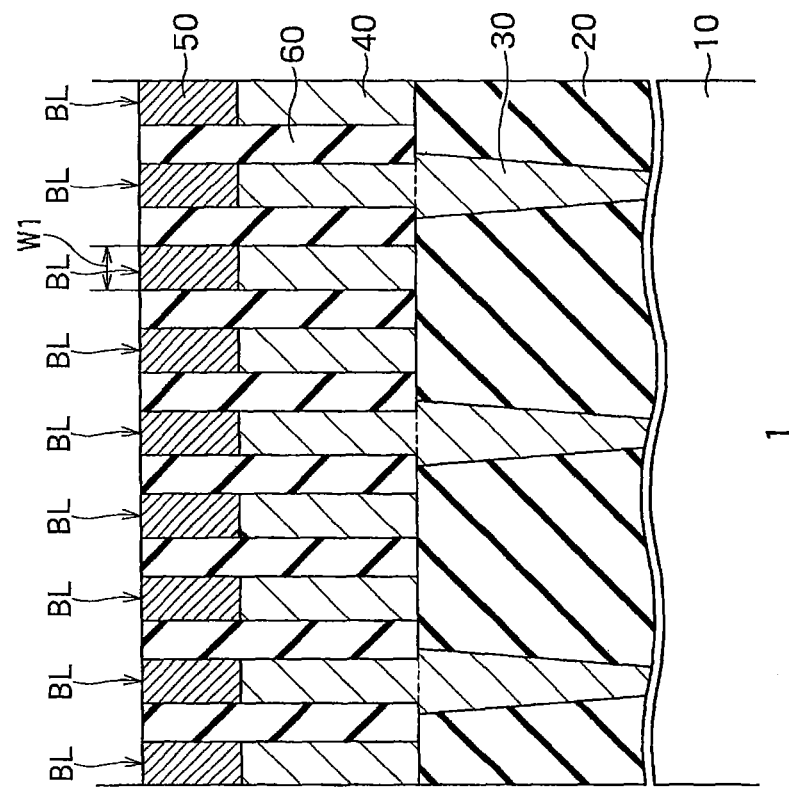

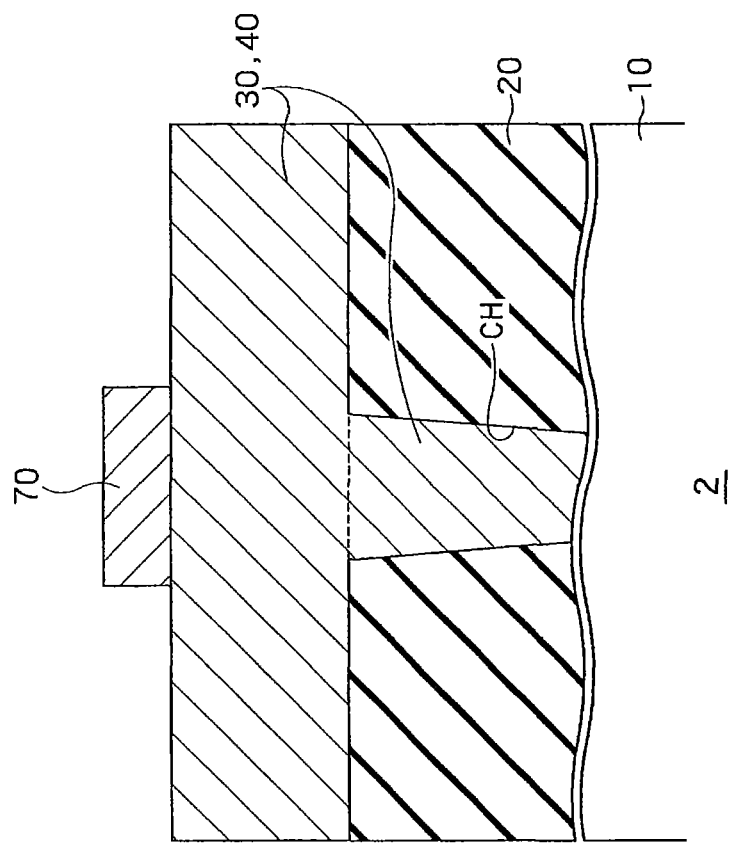
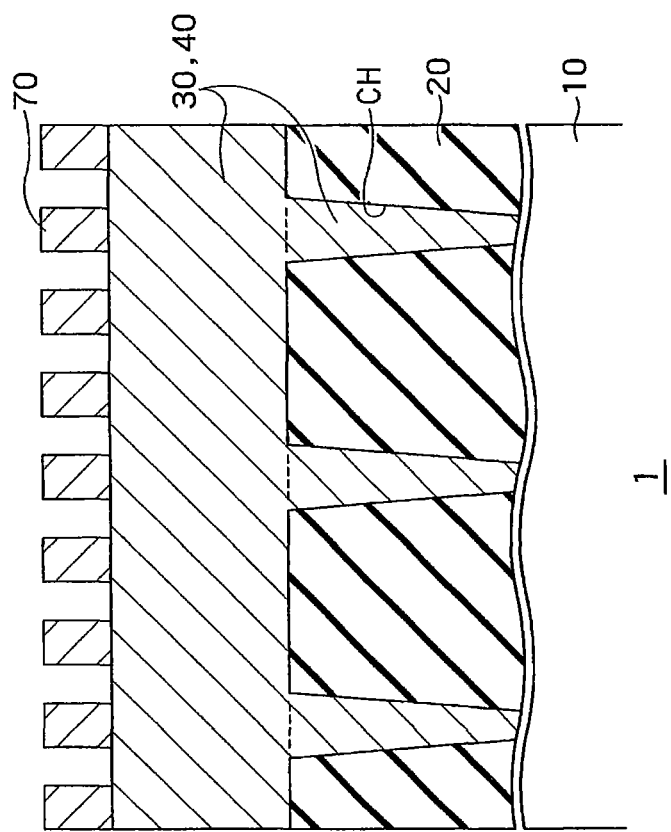

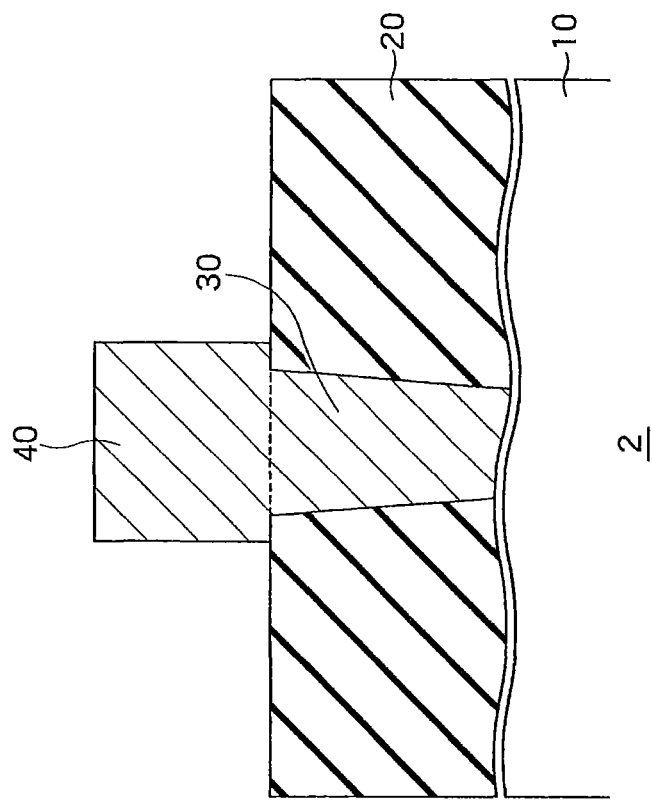
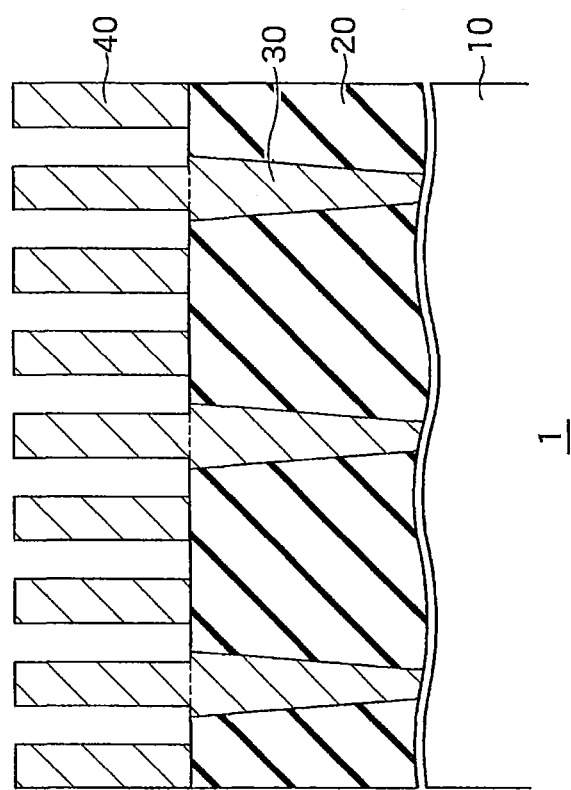
FIG. 5A
FIG. 5B

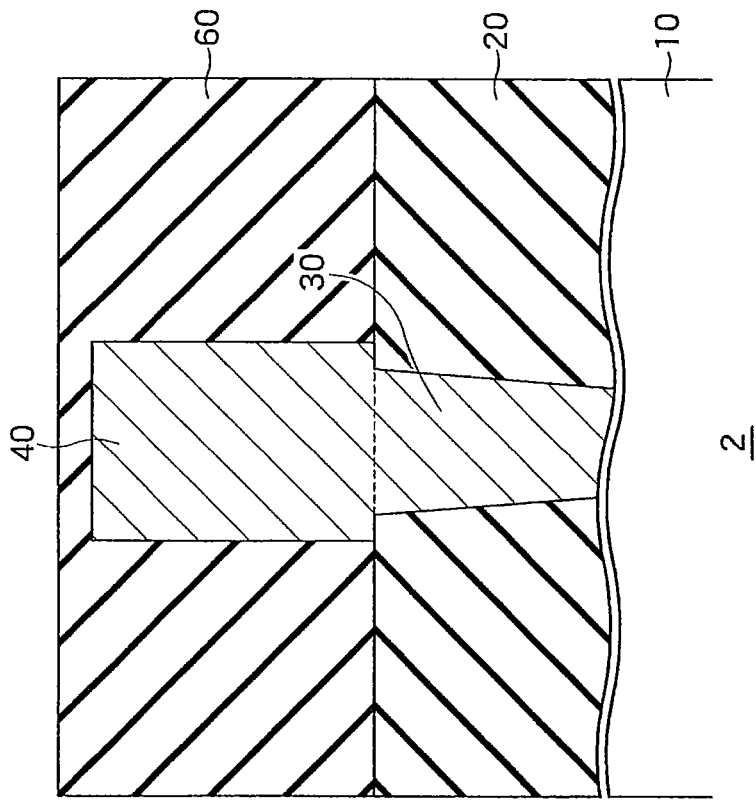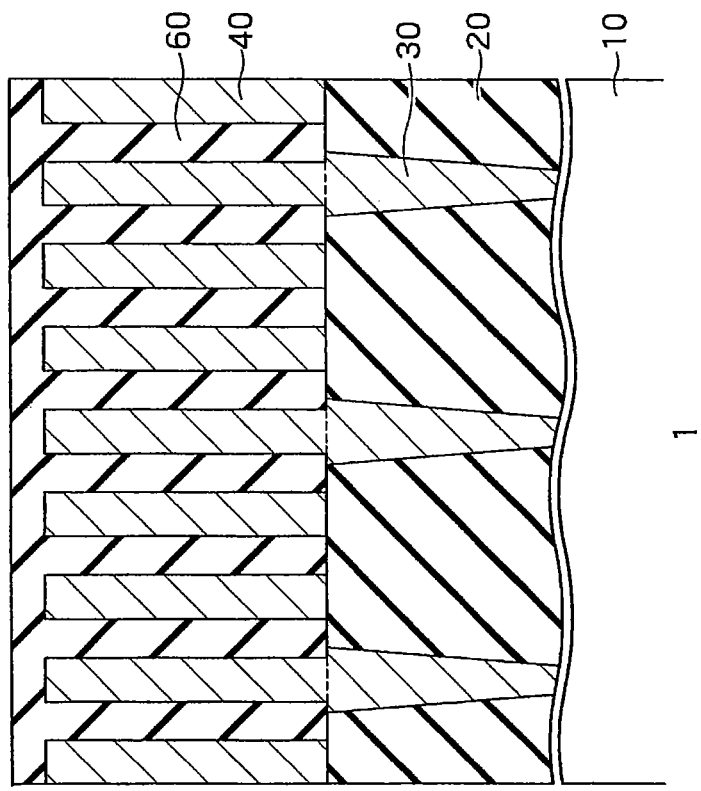
FIG. 6A
FIG. 6B

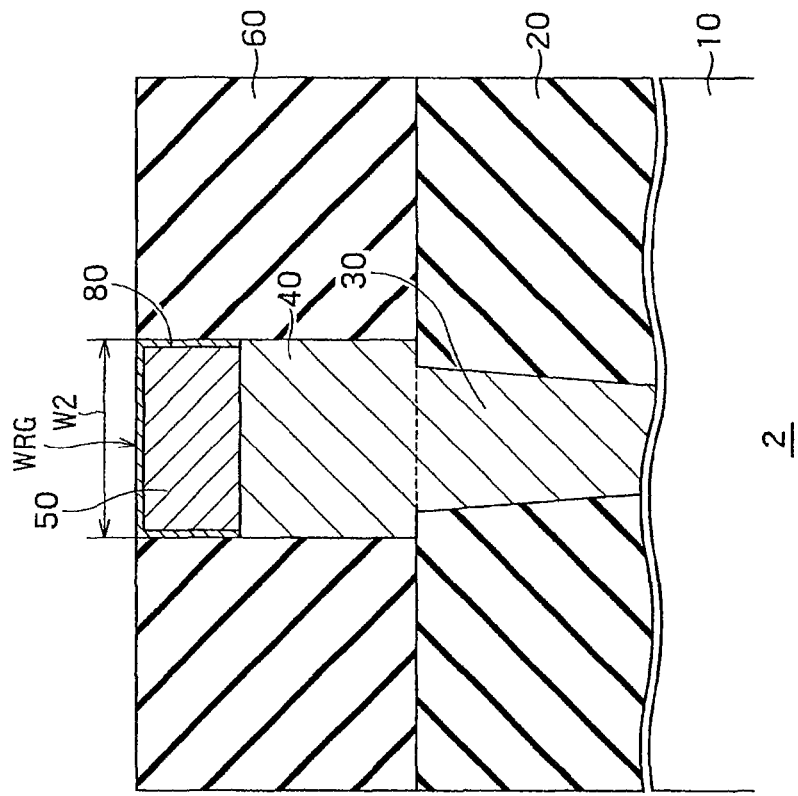
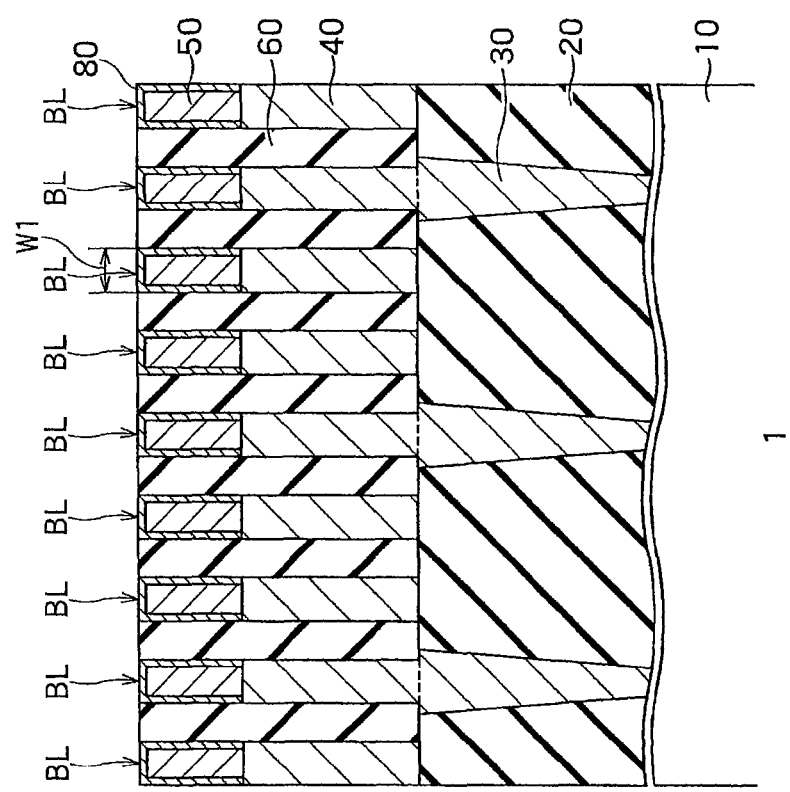

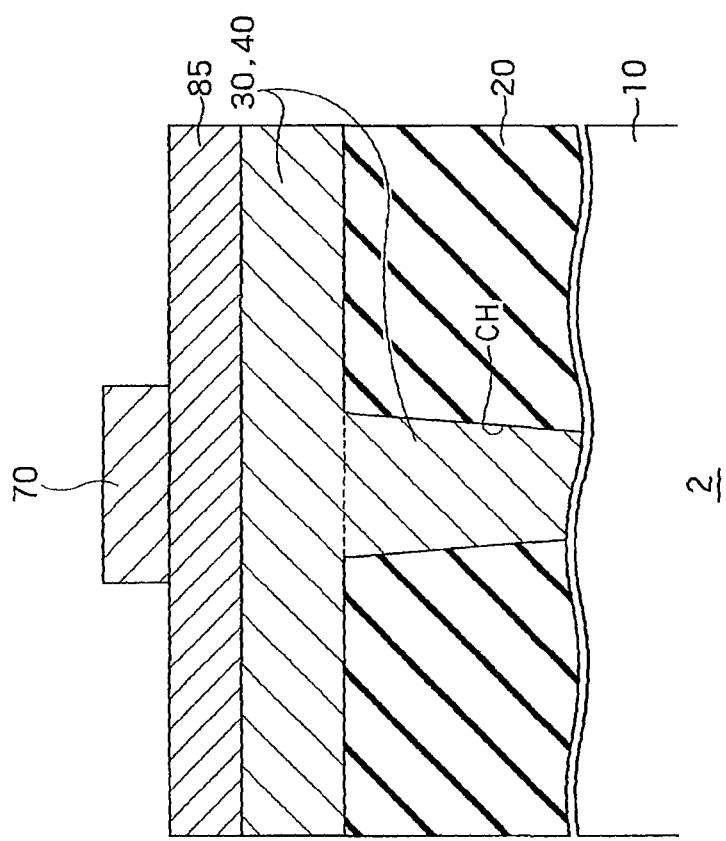
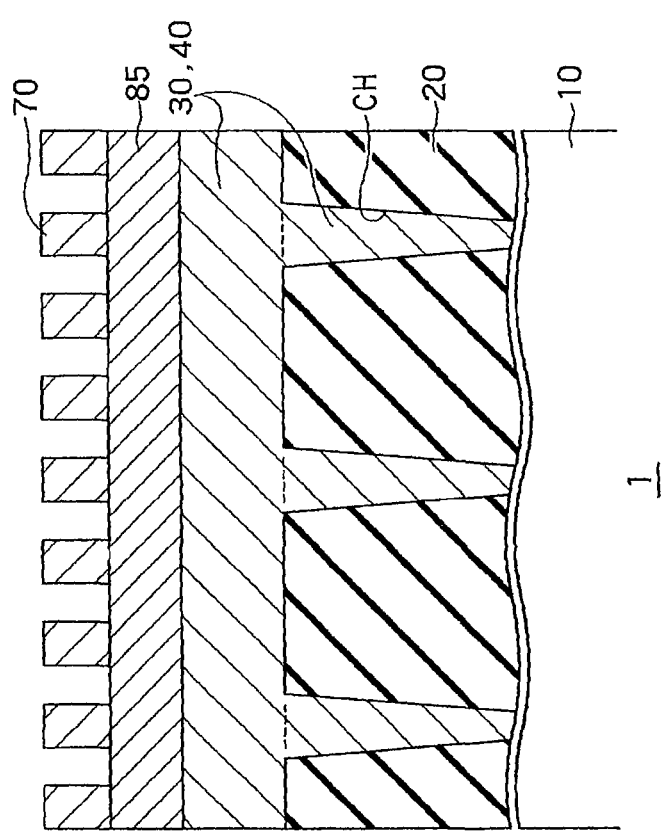
FIG. 9A
FIG. 9B

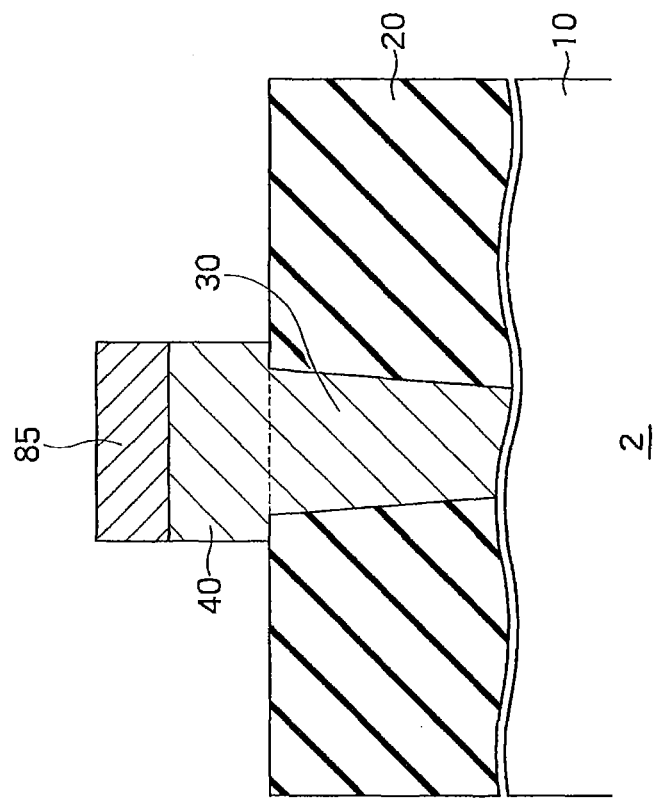
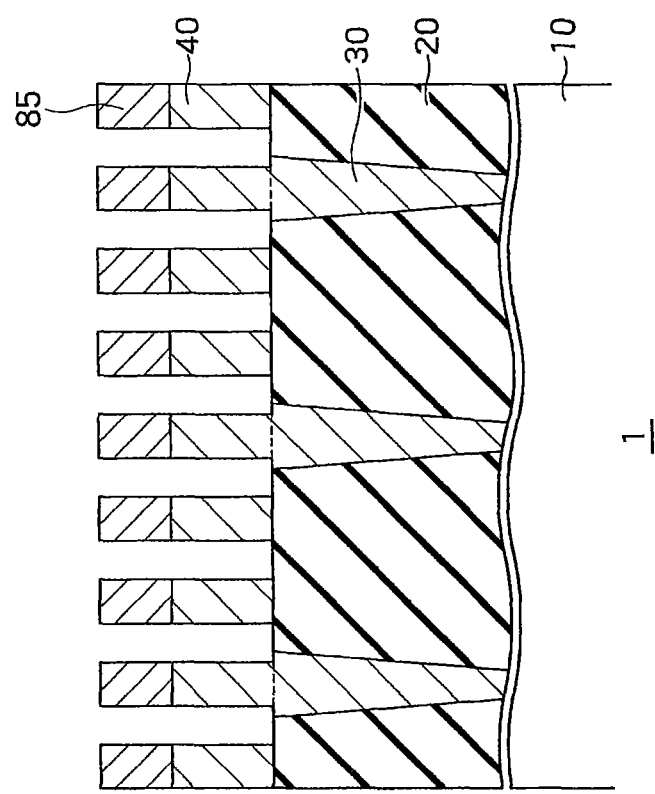
FIG. 10A
FIG. 10B

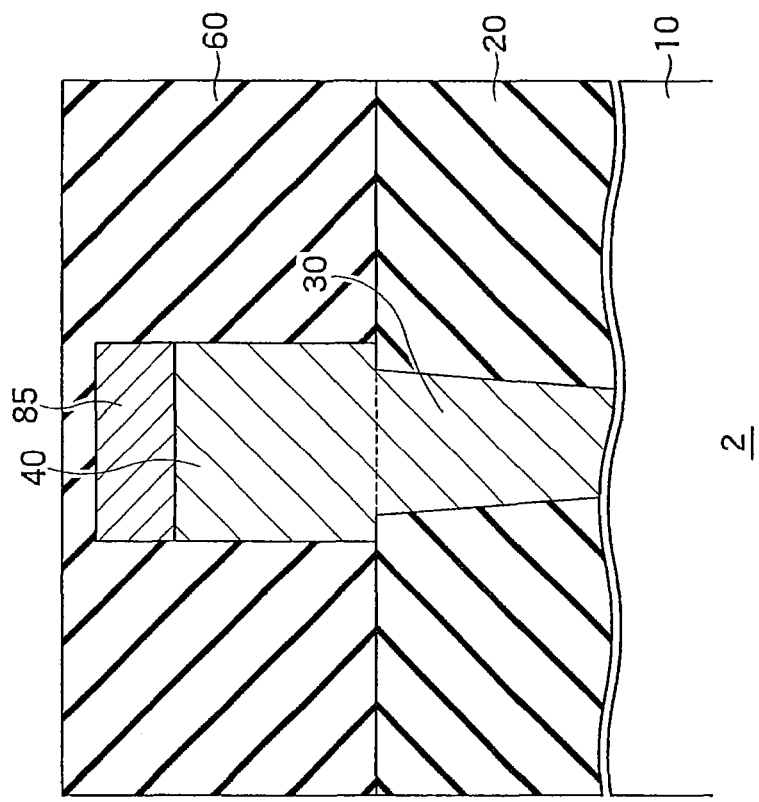
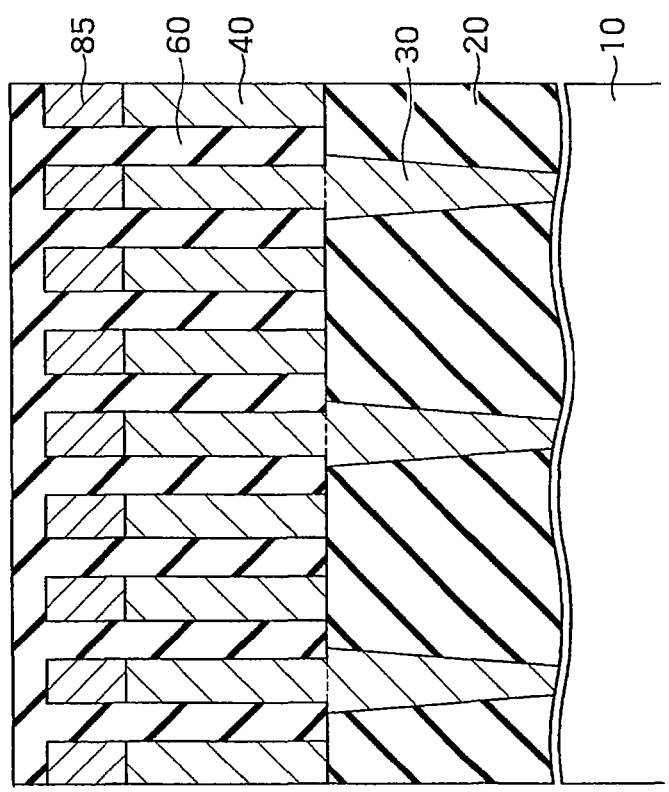
FIG. 11A
FIG. 11B

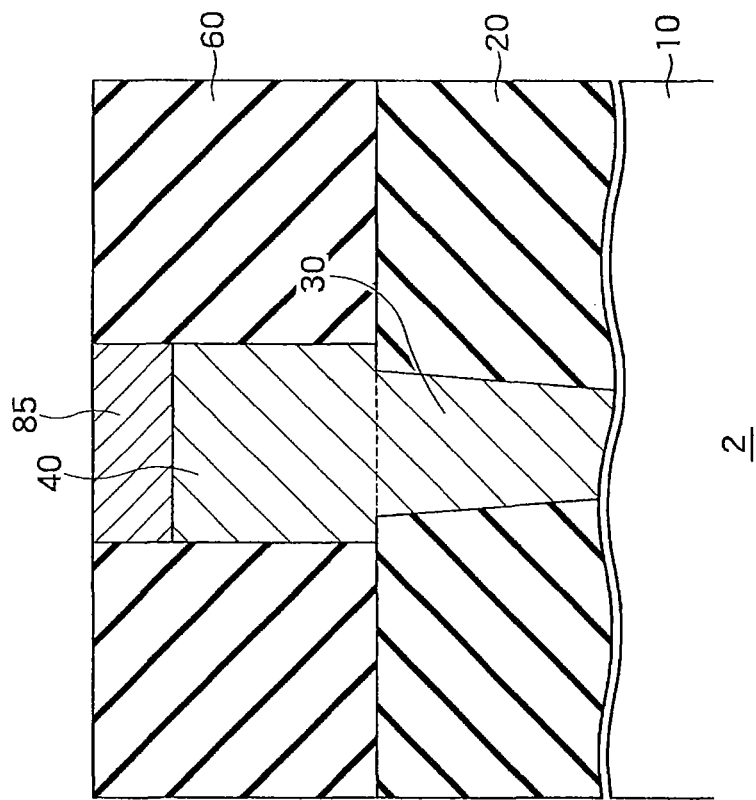
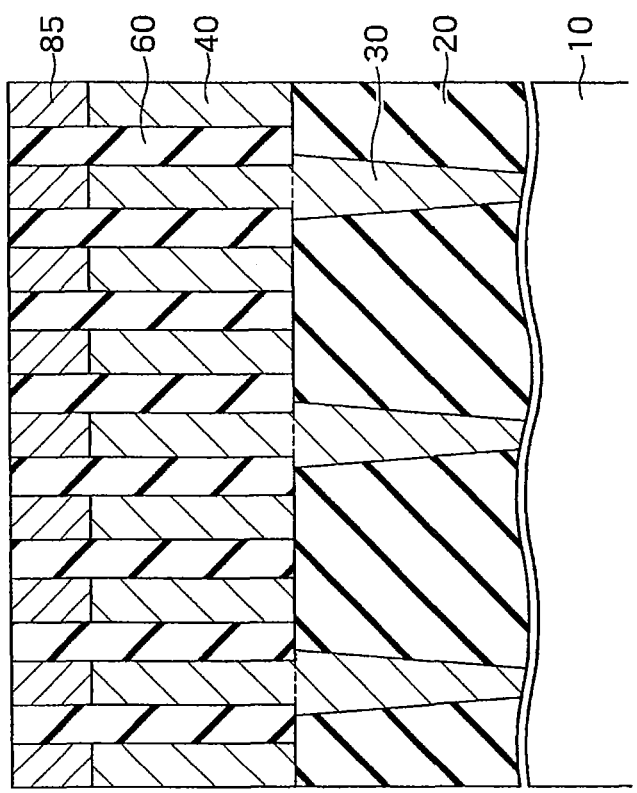
FIG. 12A
FIG. 12B

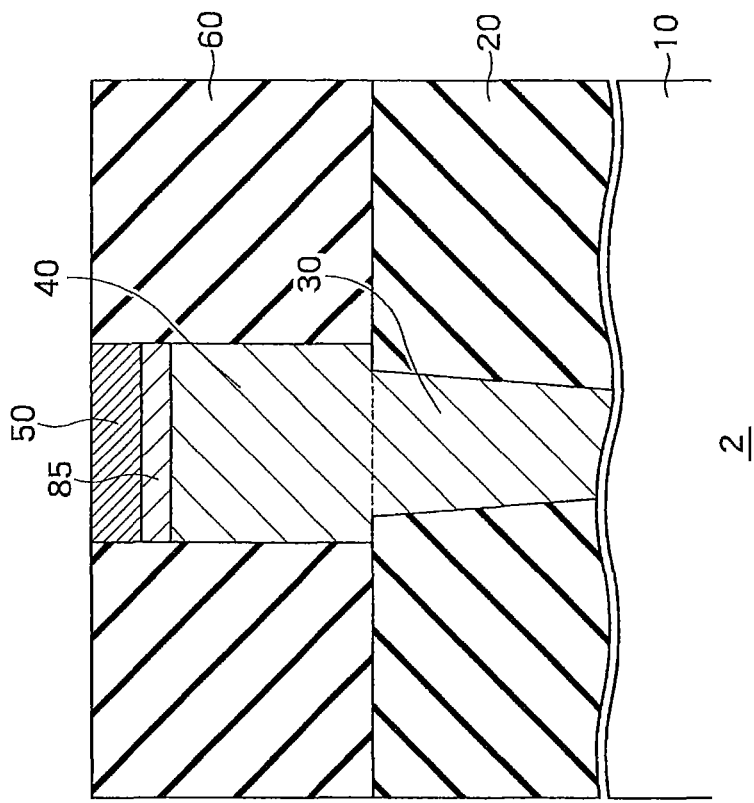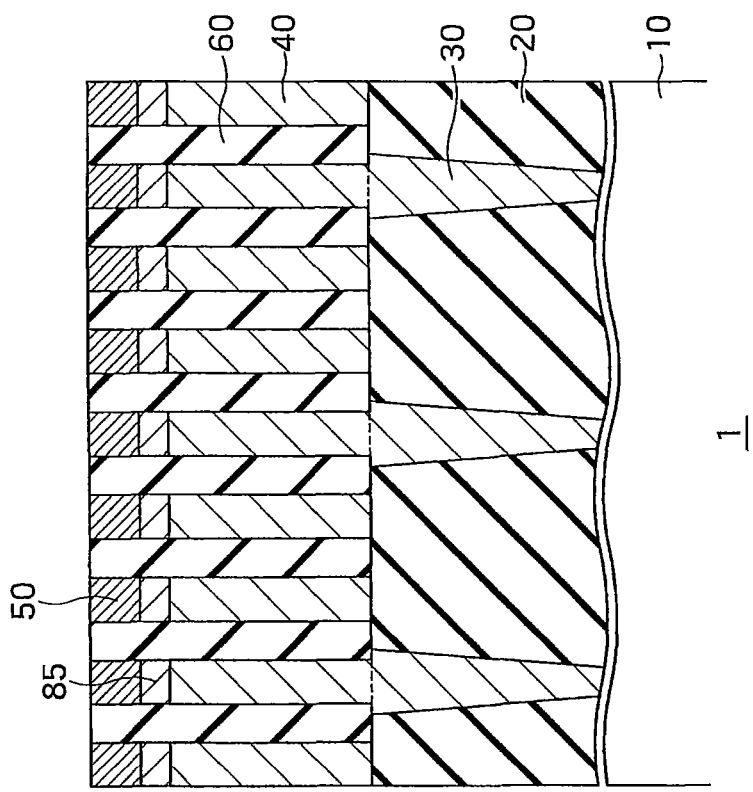
FIG. 13A
FIG. 13B

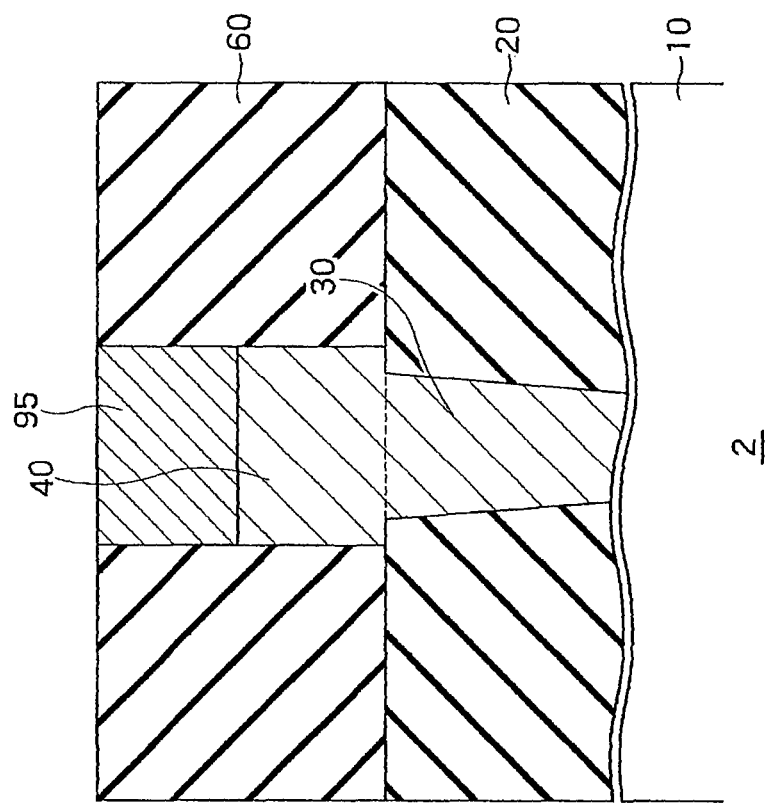
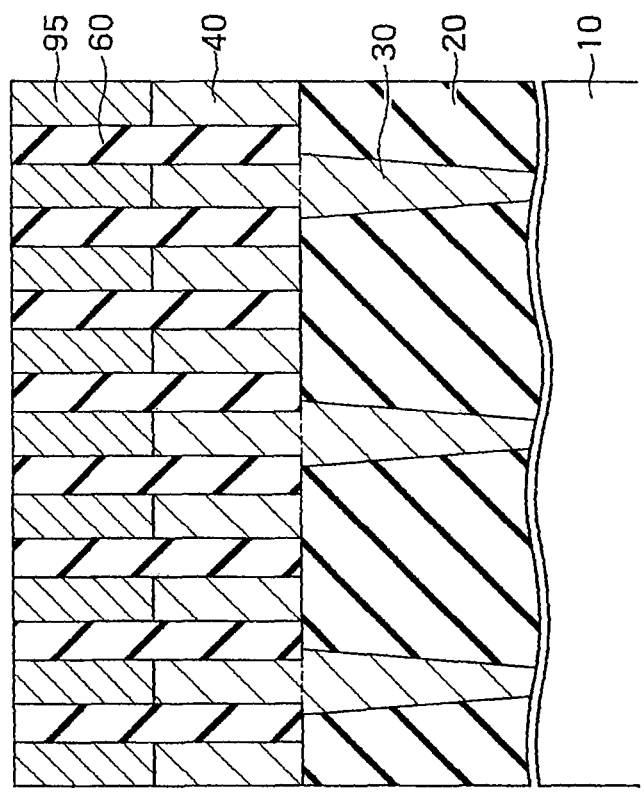
FIG. 18A
FIG. 18B

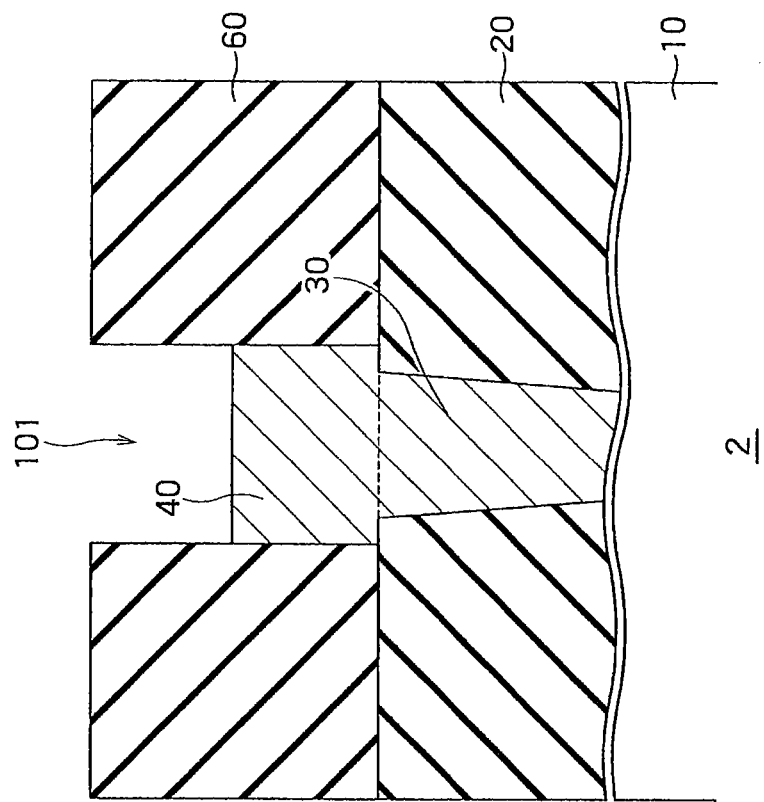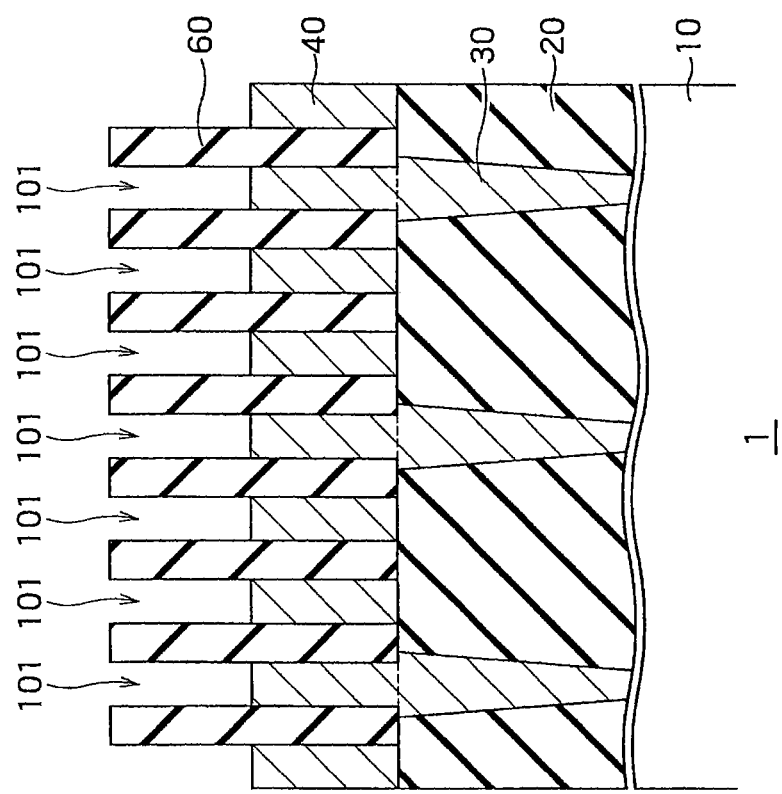

SEMICONDUCTOR DEVICE AND MANUFACTURING METHOD THEREOF

CROSS REFERENCE TO RELATED APPLICATIONS

This application is based upon and claims the benefit of priority from the prior U.S. Provisional Patent Application No. 61/917,210, filed on Dec. 17, 2013, the entire contents of which are incorporated herein by reference.

FIELD

The embodiments of the present invention relate to a semiconductor device and manufacturing method thereof.

BACKGROUND

Copper frequently used for wirings in semiconductor devices is difficult to process by an etching method. Therefore, copper wirings are often formed by embedding copper in an insulating film using a damascene method. However, as the semiconductor devices have been increasingly downscaled, embedment of copper has become more difficult. Furthermore, the resistivity of copper wirings greatly increases due to thinning. To compensate an increase in the resistivity, it is conceivable to increase the height (thickness) of the copper wirings. In this case, however, the aspect ratio increases and thus embedment of copper becomes more difficult.

On the other hand, tungsten does not require application of the damascene method and can be processed by an etching technology. Furthermore, tungsten has a higher embeddability than copper. Therefore, tungsten wirings are considered as a substitute for copper wirings. However, in wider wirings, tungsten generally has a higher resistivity than copper. Therefore, when tungsten wirings are used in a semiconductor memory that has a memory area having a small wiring width and a peripheral area having a large wiring width, or the like, the wiring resistance becomes high in the peripheral area while fine wirings can be formed in the memory area.

BRIEF DESCRIPTION OF THE DRAWINGS

FIGS. 2A and 2B are cross-sectional views showing an example of wiring portions in the memory according to the first embodiment;

FIGS. 4A to 7B are cross-sectional views showing an example of a manufacturing method of the memory according to the first embodiment;

FIGS. 8A and 8B are cross-sectional views showing an example of wiring portions in a memory according to a second embodiment;

FIGS. 9A to 13B are cross-sectional views showing an example of a manufacturing method of the memory according to the second embodiment;

FIGS. 15A to 19B are cross-sectional views showing an example of a manufacturing method of the memory according to the third embodiment.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor device according to the present embodiment includes a first wiring part located above a substrate and made of a first metal material. A second wiring part is provided as being superimposed on the first wiring part and having a width substantially equal to that of the first wiring part. A first resistivity of the first wiring part is lower than a second resistivity of the second wiring part when the first and second wiring parts have a first width. The second resistivity is lower than the first resistivity when the first and second wiring parts have a second width larger than the first width. The semiconductor device includes both of an area in which the first and second wiring parts have the first width and an area in which the first and second wiring parts have the second width.

A NAND flash memory is explained below as an example of a semiconductor device according to the present embodiment. However, the embodiment is not limited to a memory and is also applicable to other semiconductor devices.

First Embodiment

Figure 1:
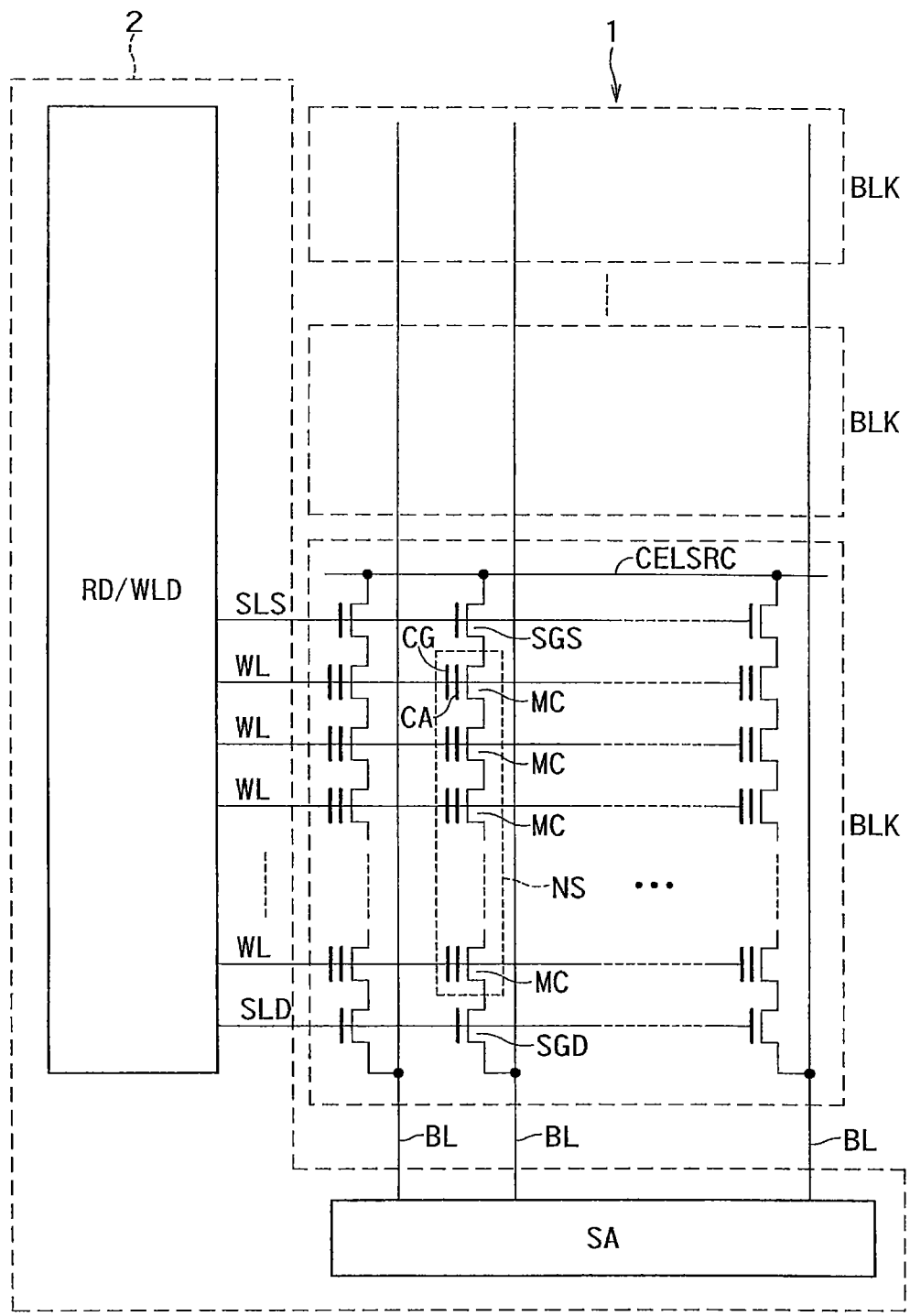
FIG. 1 shows an example of a configuration of a semiconductor device according to a first embodiment.

FIG. 1 shows an example of a configuration of a semiconductor device according to a first embodiment. The semiconductor device is, for example, a NAND flash memory (hereinafter, also simply "memory"). The memory includes a memory area 1 in which a plurality of memory cells MC are arranged two-dimensionally in matrix and a peripheral circuit area 2 that controls the memory area 1.

The memory area 1 includes a plurality of blocks BLK, and each of the blocks BLK includes a plurality of NAND strings NS. The blocks BLK are a unit of data erasure. Each of the NAND strings NS has a plurality of memory cells MC connected in series. Memory cells MC on both ends of each of the NAND strings NS are connected to selective gate transistors SGD and SGS, respectively. Memory cells MC on one end of the memory area 1 are connected to bit lines BL via the selective gate transistors SGD, respectively, and memory cells MC on the other end of the memory area 1 are connected to a cell source CELSRC via the selective gate transistors SGS, respectively.

Each of word lines WL is connected to control gates CG of memory cells MC arrayed in a row direction. Selective gate lines SLD and SLS are connected to gates of the selective gate transistors SGD and SGS, respectively. The word lines WL and the selective gate lines SLS and SLD are driven by a row decoder RD and a word line driver WLD.

Each of the bit lines BL is connected to NAND strings NS via the selective gate transistors SGD. Furthermore, the bit lines BL are connected to a sense amplifier circuit SA. A plurality of memory cells MC connected to one word line WL constitute a page, which is a unit of data reading or data writing in a batch.

When the selective gate lines SLS and SLD drive the selective gate transistors SGS and SGD, the NAND strings NS are connected between the corresponding bit lines BL and the cell source CELSRC, respectively. When the word line driver WLD drives an unselective word line WL, unselective memory cells MC are brought into an ON state. Accordingly, the sense amplifier SA can apply a voltage to the selective memory cells MC via the corresponding bit lines BL, respectively. The sense amplifier SA can thereby detect data in the selective memory cells MC or can write data in the selective memory cells MC.

FIGS. 2A and 2B are cross-sectional views showing an example of wiring portions in the memory according to the first embodiment. FIG. 2A shows a cross-section of bit lines BL in the memory area 1 and FIG. 2B shows a cross-section of a wiring WRG in the peripheral circuit area 2.

The memory according to the first embodiment includes a substrate 10, an interlayer dielectric film 20, contact plugs 30, first wiring parts 40, second wiring parts 50, and an interlayer dielectric film 60.

The substrate 10 is a semiconductor substrate such as a silicon substrate. Semiconductor elements such as the memory cells MC are provided in the memory area 1 on the substrate 10. Semiconductor elements such as transistors, capacitors, and resistive elements (not shown) are provided in the peripheral circuit area 2 on the substrate 10. The interlayer dielectric film 20 is provided above the substrate 10 to cover the semiconductor elements. The interlayer dielectric film 20 is formed using an insulating film such as a silicon dioxide film or a silicon nitride film.

Each of the contact plugs 30 passes through the interlayer dielectric film 20 to electrically connect to any of the semiconductor elements. The contact plugs 30 are formed using a conductive metal such as tungsten or molybdenum.

The first wiring parts 40 are formed on the contact plugs 30 or the interlayer dielectric film 20. The first wiring parts 40 are formed using a conductive metal such as tungsten or molybdenum. The contact plugs 30 and the first wiring parts 40 can be formed of the same material or can be formed of materials different from each other.

The second wiring parts 50 are provided to be superimposed on the first wiring parts 40 and have widths substantially equal to those of the first wiring parts 40, respectively. The second wiring parts 50 are formed using a conductive metal such as copper, silver, platinum, or gold.

Each of the first wiring parts 40 and each of the second wiring parts 50 overlap with each other in substantially equal widths, thereby forming one wiring. For example, in the memory area 1 shown in FIG. 2A, the first wiring parts 40 and the second wiring parts 50 form the bit lines BL. In the peripheral circuit area 2 shown in FIG. 2B, the first wiring parts 40 and the second wiring parts 50 form the wirings WRG. The bit lines BL and the wirings WRG extend in an orthogonal direction to the plane of paper of FIGS. 2A and 2B.

The interlayer dielectric film 60 is provided between adjacent ones of the bit lines BL and between adjacent ones of the wirings WRG. Similarly to the interlayer dielectric film 20, the interlayer dielectric film 60 is formed using an insulating film such as a silicon dioxide film or a silicon nitride film. The silicon nitride film suppresses diffusion of a metal (copper, for example). Therefore, when the interlayer dielectric film 60 is formed using the silicon nitride film, the interlayer dielectric film 60 can suppresses diffusion of materials of the first and second wiring parts 40 and 50. For example, even when copper is used for the second wiring ports 50, the interlayer dielectric film 60 can suppress diffusion of copper.

In the first embodiment, as mentioned above, the first wiring parts 40 and the second wiring parts 50 have widths substantially equal to each other. For example, the widths of the bit lines BL in the memory area 1 (the widths of the first wiring parts 40 and the second wiring parts 50) are substantially equal to each other and W1. The widths of the wirings WRG in the peripheral circuit area 2 (the widths of the first wiring parts 40 and the second wiring parts 50) are substantially equal to each other and W2. The width W1 of the bit lines BL in the memory area 1 is smaller than the width W2 of the wirings WRG in the peripheral circuit area 2.

Relations between the wiring width and the resistivity of materials of the first wiring parts 40 and the second wiring parts 50 are explained below.

Figure 3:
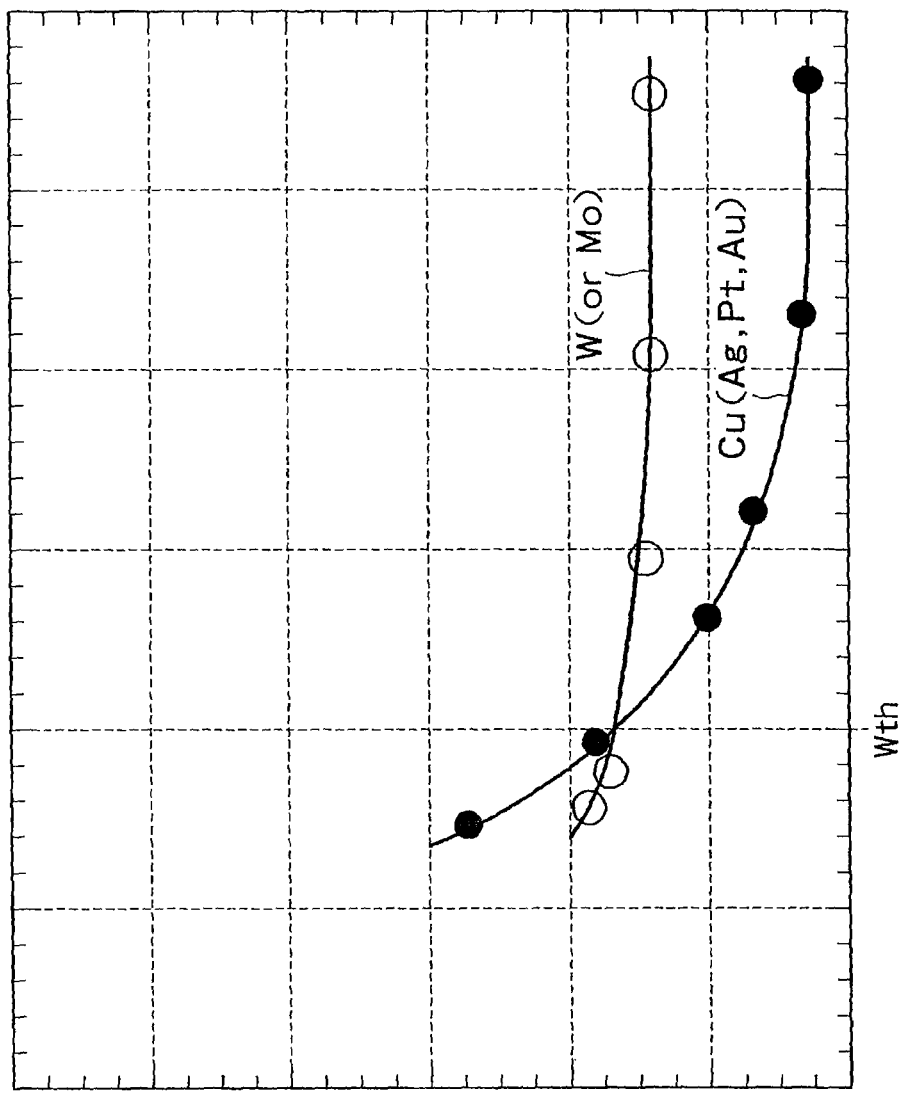
FIG. 3 is a graph showing relations between the wiring width and the resistivity with respect to a copper wiring and a tungsten wiring.

FIG. 3 is a graph showing relations between the wiring width and the resistivity with respect to a copper wiring and a tungsten wiring. When the wiring width is larger than Wth, the resistivity of the copper wiring is lower than that of the tungsten wiring. That is, it can be said that it is preferable to use copper as the material of the wirings when the wiring width is sufficiently large. On the other hand, when the wiring width is smaller than Wth, the resistivity of the tungsten wiring is lower than that of the copper wiring. That is, it can be said that it is preferable to use tungsten as the material of the wirings when the wiring width is quite small. As described above, the relationship in the resistivity between copper and tungsten is reversed before and after the wiring width Wth as a threshold (hereinafter, "threshold width Wth") and a suitable wiring material having a lower resistivity differs according to the wiring width.

For example, when the width W1 of the bit lines BL in the memory area 1 is smaller than the threshold width Wth, tungsten is preferably used for the bit lines BL in the memory area 1. When the width W2 of the wirings WRG in the peripheral circuit area 2 is larger than the threshold width Wth, copper is preferably used for the wirings WRG in the peripheral circuit area 2. Silver, platinum, and gold have relations similar to that of copper with respect to tungsten. Molybdenum has a relation similar to that of tungsten with respect to copper, silver, platinum, or gold.

According to the first embodiment, the bit lines BL and the wirings WRG each have a two-layer structure including the first wiring part 40 and the second wiring part 50. Therefore, when the width W1 of the bit lines BL in the memory area 1 is a first width smaller than the threshold width Wth, the resistivity of the first wiring part 40 (tungsten, for example) in each of the bit lines BL is lower than that of the second wiring part 50 (copper, for example) in the bit line BL. Accordingly, the bit lines BL can have relatively-lower resistances because of the first wiring parts 40, respectively. On the other hand, when the width W2 of the wirings WRG in the peripheral circuit area 2 is a second width larger than the threshold width Wth, the resistivity of the second wiring part 50 (copper, for example) in each of the wirings WRG is lower than that of the first wiring part 40 (tungsten, for example) in the wiring WRG. Therefore, the wirings WRG in the peripheral circuit area 2 can have relatively-lower resistances because of the second wiring parts 50, respectively.

In this way, the wirings according to the first embodiment are formed by stacking plural materials the relation in the resistivity of which is reversed depending on the wiring width. Therefore, even when the memory has wirings with various widths in the memory area 1 and the peripheral circuit area 2, the resistances of the wirings in the memory area 1 and the peripheral circuit area 2 can be reduced.

Furthermore, according to the first embodiment, the material (tungsten or molybdenum, for example) of the first wiring parts 40 can be processed by an etching method such as an RIE (Reactive Ion Etching) method. Therefore, the first wiring parts 40 can be formed finely by lithography and the RIE method, without using the damascene method.

As mentioned above, when the bit lines BL in the memory area 1 are to be formed increasingly finely, it is difficult to form the bit lines BL made of a material such as copper, silver, platinum, or gold by the damascene method. However, according to the first embodiment, the first wiring parts 40 made of a material such as tungsten or molybdenum can be processed finely by an etching method such as the RIE method. As a result, the bit lines BL in the memory area 1 can be formed finely and in low resistances, respectively.

Meanwhile, the material (copper, silver, platinum, or gold, for example) of the second wiring parts 50 has a lower ionization tendency than the material of the first wiring parts 40. Therefore, the material of the second wiring parts 50 is difficult to process by etching; however, the second wiring parts 50 can be selectively formed on the first wiring parts 40 by an electroless plating method, respectively. Accordingly, even when the second wiring parts 50 are a material with a low embeddability such as copper, silver, platinum, or gold, the second wiring parts 50 can be formed on the first wiring parts 40 finely processed, respectively. As a result, the bit lines BL can be two-layer wirings each including the first and second wiring parts 40 and 50 and thus have lower resistances, respectively. The second wiring parts 50 can be selectively formed on the first wiring parts 40 also in the wirings WRG in the peripheral circuit area 2, respectively. The width of the wirings WRG is relatively large. Accordingly, the second wiring parts 50 are lower in the resistivity than the first wiring parts 40. As a result, the resistances of the wirings WRG also become lower.

As described above, according to the first embodiment, even when the wirings have various widths, increase in the downscaling of the wirings and reduction in the resistances of the wirings can be both achieved.

FIGS. 4A to 7B are cross-sectional views showing an example of a manufacturing method of the memory according to the first embodiment. FIGS. 4A, 5A, 6A, and 7A show cross-sections of the memory area 1 and FIGS. 4B, 5B, 6B, and 7B show cross-sections of the peripheral circuit area 2.

Semiconductor elements (not shown) are first formed on the substrate 10 using a semiconductor process technology. For example, semiconductor elements such as the memory cells MC are formed in the memory area 1. Other semiconductor elements such as transistors, capacitors, and resistors are formed in the peripheral circuit area 2.

The interlayer dielectric film 20 is then formed on the substrate 10 to cover the semiconductor elements. Contact holes CH are then formed in the interlayer dielectric film 20. The contact holes CH pass through the interlayer dielectric film 20 to reach the semiconductor elements on the substrate 10.

Materials of the contact plugs 30 and the first wiring parts 40 are then deposited in the contact holes CH and on the interlayer dielectric film 20 as shown in FIGS. 4A and 4B. The contact plugs 30 and the first wiring parts 40 can be formed of the same material. In this case, the materials of the contact plugs 30 and the first wiring parts 40 can be deposited continuously in the same process. This enables to shorten the manufacturing process. Needless to mention that the materials of the contact plugs 30 and the first wiring parts 40 can be different from each other. In this case, the materials of the contact plugs 30 and the first wiring parts 40 are deposited continuously in a plurality of processes. In this case, the material of the contact plugs 30 can be a low-resistance metal such as copper or aluminum, as well as tungsten or molybdenum.

A material of a hard mask 70 is then deposited on the material of the first wiring parts 40. The material of the hard mask 70 is, for example, a silicon dioxide film, a silicon nitride film, or polysilicon.

The hard mask 70 is then processed using a lithographic technique and an etching technique. To form fine wirings (bit lines, for example) in the memory area 1 shown in FIG. 4A, the hard mask 70 is formed using a sidewall transfer technology. Alternatively, the hard mask 70 can be formed using a lithographic technique such as a nanoimprint technique. In this way, the hard mask 70 can be processed in fine patterns in the memory area 1 as shown in FIG. 4A.

The material of the first wiring parts 40 is then processed by the RIE method using the hard mask 70 as a mask as shown in FIGS. 5A and 5B. The material of the first wiring parts 40 is etched up to the upper surface of the interlayer dielectric film 20 in such a manner that adjacent ones of the first wiring parts 40 are electrically separated from each other. The first wiring parts 40 are thereby formed. As described above, the material (tungsten or molybdenum, for example) of the first wiring parts 40 can be processed by the RIE method.

A material of the interlayer dielectric film 60 is then deposited to cover the upper and side surfaces of the first wiring parts 40 as shown in FIGS. 6A and 6B. The material of the interlayer dielectric film 60 is an insulating film such as a silicon dioxide film or a silicon nitride film. This enables the interlayer dielectric film 60 to be filled between adjacent ones of the first wiring parts 40 as shown in FIG. 6A. As mentioned above, the interlayer dielectric film 60 can suppress diffusion of the material of the first wiring parts 40 and a material of the second wiring parts 50 when the interlayer dielectric film 60 is formed using the silicon nitride film. For example, even when copper is used for the second wiring parts 50, the interlayer dielectric film 60 can suppress diffusion of copper.

Figure 7A:
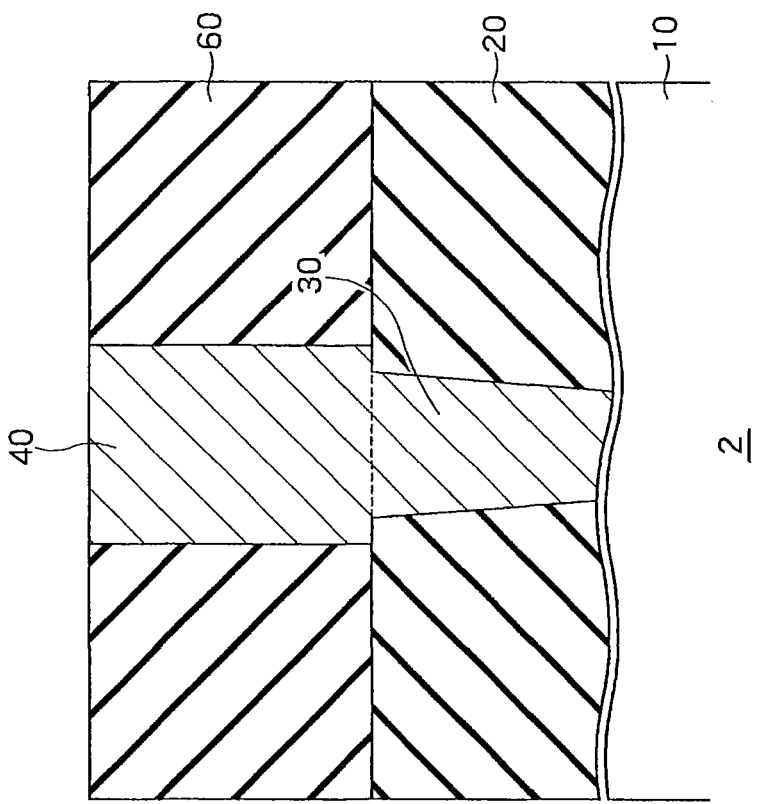
Figure 7B:
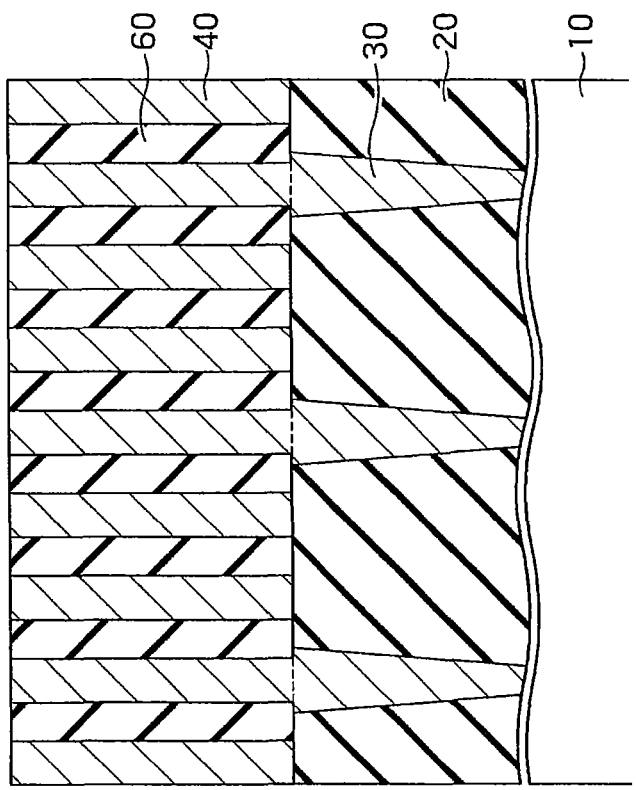

The interlayer dielectric film 60 is then polished using a CMP (Chemical Mechanical Polishing) method until the upper surfaces of the first wiring parts 40 are exposed. A structure shown in FIGS. 7A and 7B is thereby obtained.

A material of the second wiring parts 50 is then selectively deposited on the first wiring parts 40 using the electroless plating method. For example, a displacement plating method is used as the electroless plating method. The displacement plating method is a method to perform plating by displacing a material with another material utilizing the magnitude of the ionization tendency (the standard electrode potential). For example, copper, silver, platinum, and gold have lower ionization tendencies (higher standard electrode potentials) than tungsten. That is, copper, silver, platinum, and gold are nobler metals than tungsten. Therefore, copper, silver, platinum, or gold can be displacement plated on a tungsten layer. When copper, silver, platinum, or gold is displacement plated on a tungsten layer, a surface portion of the tungsten layer is displaced with copper, silver, platinum, or gold.

When the material of the first wiring parts 40 is tungsten, copper, silver, platinum, or gold is used as the material of the second wiring parts 50. That is, the material of the second wiring parts 50 is a metal with a lower ionization tendency than that of the material of the first wiring parts 40. Accordingly, the material of the second wiring parts 50 can be selectively deposited on the surfaces of the first wiring parts 40 using the displacement plating method.

Even when the material of the first wiring parts 40 is molybdenum, copper, silver, platinum, or gold can be used as the material of the second wiring parts 50. Also in this case, the material of the second wiring parts 50 is a metal with a lower ionization tendency than that of the material of the first wiring parts 40. Therefore, the material of the second wiring parts 50 can be selectively deposited on the surfaces of the first wiring parts 40 using the displacement plating method.

As the material of the second wiring parts 50, copper or silver having a low ionization tendency, having a low metal resistivity, and being relatively inexpensive is preferable.

A plating bath used for displacement plating includes an aqueous solution of the metal material of the second wiring parts 50. By immersing the substrate 10 in the plating bath, the metal material of the second wiring parts 50 is displacement plated on the surfaces of the first wiring parts 40.

Because, for example, tungsten is dissolved by an alkaline solution, it is preferable that the solution in the plating bath be alkaline. On the other hand, silver is precipitated as a silver oxide in an alkaline solution. Therefore, when tungsten is used for the first wiring parts 40 and silver is used for the second wiring parts 50, silver needs to be complexed and dissolved in an alkaline solution to create a complex bath (an amine complex bath, for example). At that time, a complexing agent is used. Examples of the complexing agent include ammonia, ethylenediamine, and cyanogen.

An interlayer dielectric film, contact plugs, wirings, and the like (not shown) are then formed on the second wiring parts 50, whereby the memory according to the first embodiment is completed.

According to the first embodiment, the material of the second wiring parts 50 is formed on the first wiring parts 40 by the electroless plating method. Therefore, the material of the second wiring parts 50 is selectively formed on the first wiring parts 40 and is not formed on the interlayer dielectric film 60. Accordingly, a polishing process such as the CMP method after formation of the second wiring parts 50 can be eliminated. That is, addition of the electroless plating process to the semiconductor manufacturing process may suffice in the manufacturing method according to the first embodiment. Needless to mention that the material of the second wiring parts 50 can be polished using a polishing process such as the CMP method.

According to the first embodiment, the first wiring parts 40 (tungsten or molybdenum, for example) can be formed finely by an etching technique such as the RIE method. Furthermore, the second wiring parts 50 (copper, silver, platinum, or gold, for example) can be selectively deposited on the finely-processed first wiring parts 40 by the electroless plating. Accordingly, the bit lines BL in the memory area 1 can be formed finely and in low resistances. Additionally, the wirings WRG in the peripheral circuit area 2 can be reduced in the resistances due to the second wiring parts 50 with a relatively-low resistivity. That is, according to the first embodiment, increase in the downscaling (and reduction in the resistances) of the bit lines BL and reduction in the resistances of the wirings WRG in the peripheral circuit area 2 can be both achieved.

Second Embodiment

FIGS. 8A and 8B are cross-sectional views showing an example of wiring portions in a memory according to a second embodiment. FIG. 8A shows a cross-section of bit line portions in the memory area 1 and FIG. 8B shows a cross-section of a wiring portion in the peripheral circuit area 2.

The memory according to the second embodiment includes a manganese oxide (MnOx) film 80 formed on the upper and side surfaces of the second wiring parts 50. Other configurations of the second embodiment can be identical to corresponding ones of the first embodiment.

The manganese oxide film 80 functions as a barrier metal. Therefore, the manganese oxide film 80 can suppress diffusion of the material of the second wiring parts 50. Furthermore, the second embodiment can achieve effects identical to those of the first embodiment.

FIGS. 9A to 13B are cross-sectional views showing an example of a manufacturing method of the memory according to the second embodiment. FIGS. 9A, 10A, 11A, 12A, and 13A show cross-sections of the memory area 1 and FIGS. 9B, 10B, 11B, 12B, and 13B show cross-sections of the peripheral circuit area 2.

Similarly to the manufacturing method according to the first embodiment, semiconductor elements are first formed on the substrate 10. The interlayer dielectric film 20 is then deposited on the substrate 10 and the contact holes CH are formed in the interlayer dielectric film 20. The materials of the contact plugs 30 and the first wiring parts 40 are further deposited in the contact holes CH and on the interlayer dielectric film 20.

A manganese layer 85 is then deposited on the material of the first wiring parts 40 as shown in FIGS. 9A and 9B. The hard mask 70 is further formed on the manganese layer 85. The formation method of the hard mask 70 can be identical to that in the first embodiment.

The manganese layer 85 and the material of the first wiring parts 40 are then processed by the RIE method using the hard mask 70 as a mask as shown in FIGS. 10A and 10B. The manganese layer 85 and the material of the first wiring parts 40 are etched until the upper surface of the interlayer dielectric film 20 is exposed. Adjacent portions of the manganese layer 85 are electrically separated from each other. Adjacent ones of the first wiring parts 40 are also electrically separated from each other. An oxidized surface of the manganese layer 85 is then reduced.

The material of the interlayer dielectric film 60 is then deposited to cover the manganese layer 85 and the first wiring parts 40 as shown in FIGS. 11A and 11B. Accordingly, the interlayer dielectric film 60 is filled between adjacent portions of the manganese layer 85 and between adjacent ones of the first wiring parts 40 as shown in FIG. 11A. The material of the interlayer dielectric film 60 can be identical to that in the first embodiment.

The interlayer dielectric film 60 is then polished by using the CMP method until the upper surface of the manganese layer 85 is exposed. In this way, a structure shown in FIGS. 12A and 12B is obtained.

The material of the second wiring parts 50 is then selectively deposited on the manganese layer 85 using the electroless plating method. For example, the displacement plating method is used as the electroless plating method. Copper, silver, platinum, and gold have lower ionization tendencies (higher standard electrode potentials) than manganese. Therefore, copper, silver, platinum, or gold can be displacement plated on the manganese layer 85. When copper, silver, platinum, or gold is displacement plated on the manganese layer 85, a surface portion of the manganese layer 85 is displaced with copper, silver, platinum, or gold as shown in FIGS. 13A and 13B. By using the displacement plating method, the material of the second wiring parts 50 can be selectively deposited on the surface of the manganese layer 85.

A plating bath used for displacement plating includes an aqueous solution of the metal material of the second wiring parts 50. By immersing the substrate 10 in the plating bath, the metal material of the second wiring parts 50 is displacement plated on the surface of the manganese layer 85.

For example, manganese is dissolved by an acid solution and thus it is preferable that the solution in the plating bath be acid. Copper, silver, platinum, or gold is also dissolved by an acid solution. Therefore, an acid plating bath can be created by dissolving the material of the second wiring parts 50 in an acid solution. By immersing the manganese layer 85 in the acid plating bath, the material of the second wiring parts 50 can be displacement plated on the surface of the manganese layer 85.

The substrate 10 is then annealed at a temperature of about 100° C. The manganese layer 85 is thereby precipitated around the second wiring parts 50. At that time, the manganese layer 85 precipitated on the side surfaces of the second wiring parts 50 is oxidized by oxygen included in the interlayer dielectric film 60. The manganese layer 85 precipitated on the upper surfaces of the second wiring parts 50 is oxidized by oxygen included in an atmosphere in the annealing process. In this way, the manganese oxide film 80 is formed on the upper and side surfaces of the second wiring parts 50 as shown in FIGS. 8A and 8B.

Subsequently, an interlayer dielectric film, contact plugs, wirings, and the like (not shown) are formed on the manganese oxide film 80, whereby the memory according to the second embodiment is completed.

According to the second embodiment, the manganese oxide film 80 is formed around the second wiring parts 50 (on the upper and side surfaces). The manganese oxide film 80 functions as a barrier metal and can suppress diffusion of the second wiring parts 50 (copper or silver, for example) to the interlayer dielectric film and the like. Furthermore, the second embodiment can achieve effects identical to those of the first embodiment.

Third Embodiment

Figure 14A:
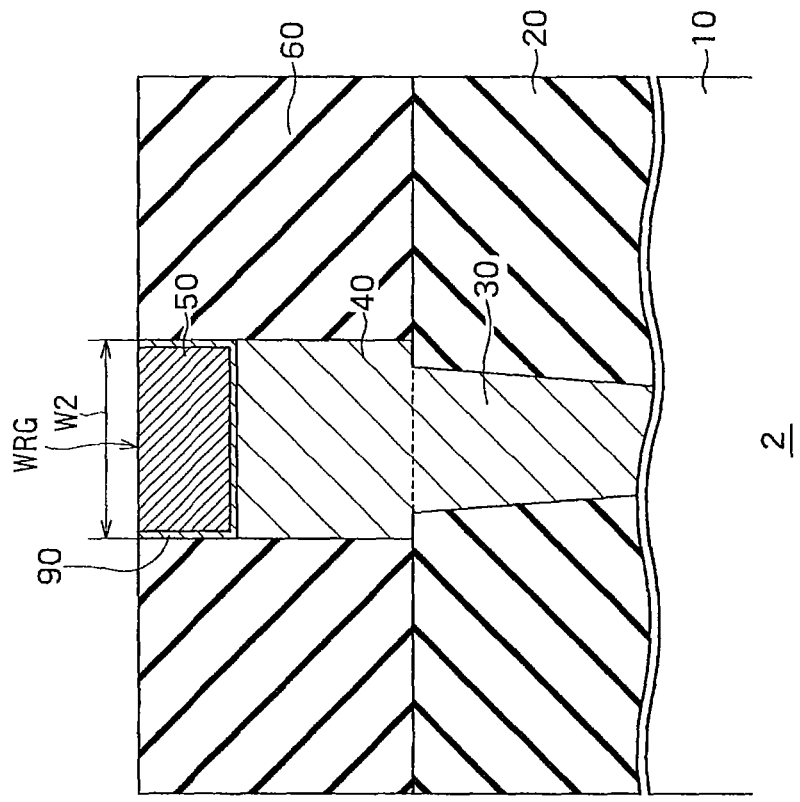
FIGS. 14A and 14B are cross-sectional views showing an example of wiring portions in a memory according to a third embodiment.
Figure 14B:
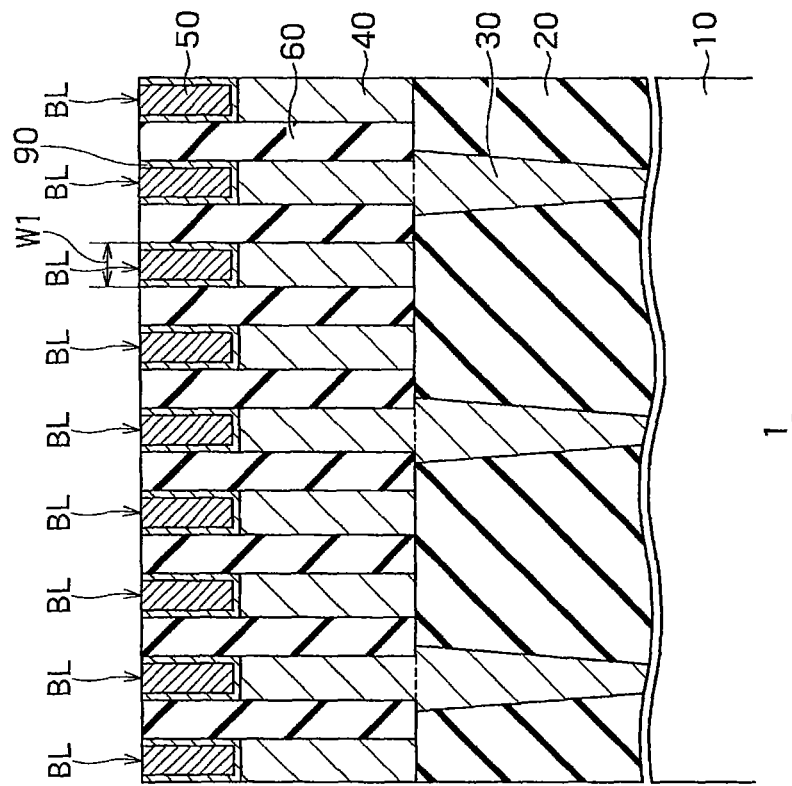

FIGS. 14A and 14B are cross-sectional views showing an example of wiring portions in a memory according to a third embodiment. FIG. 14A shows a cross-section of bit line portions in the memory area 1 and FIG. 14B shows a cross-section of a wiring portion in the peripheral circuit area 2.

The memory according to the third embodiment has a barrier film 90 formed on the bottom and side surfaces of the second wiring parts 50. Other configurations of the third embodiment can be identical to corresponding ones of the first embodiment.

The barrier film 90 is formed using a conductive material such as titanium, tantalum, or TaN. The barrier film 90 can suppress diffusion of the material of the second wiring parts 50.

As explained later, the second wiring parts 50 are formed using a sputtering method or an electrolytic plating method. Therefore, the second wiring parts 50 are formed of a material that can be deposited on the barrier film 90 by the sputtering method or the electrolytic plating method. Additionally, the material of the second wiring parts 50 is a material that is lower in the resistivity than the material of the first wiring parts 40 in wirings wider than the threshold width Wth. Furthermore, the third embodiment can achieve effects identical to those of the first embodiment.

FIGS. 15A to 19B are cross-sectional views showing an example of a manufacturing method of the memory according to the third embodiment. FIGS. 15A, 16A, 17A, 18A, and 19A show cross-sections of the memory area 1 and FIGS. 15B, 16B, 17B, 18B, and 19B show cross-sections of the peripheral circuit area 2.

Similarly to the manufacturing method according to the first embodiment, semiconductor elements are first formed on the substrate 10. The interlayer dielectric film 20 is then deposited on the substrate 10 and the contact holes CH are formed in the interlayer dielectric film 20. The materials of the contact plugs 30 and the first wiring parts 40 are further deposited in the contact holes CH and on the interlayer dielectric film 20.

Figure 15A:
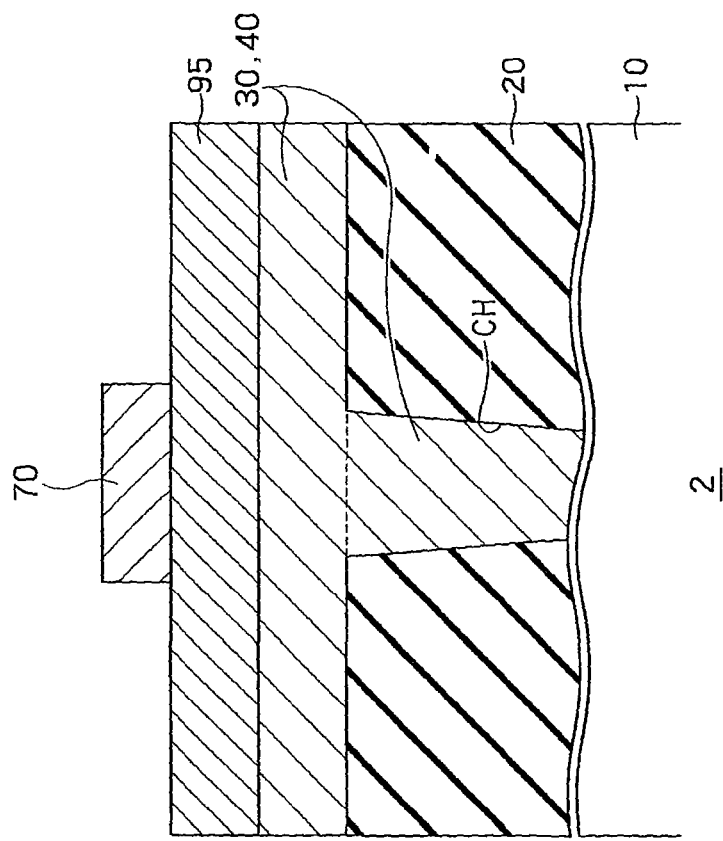
Figure 15B:
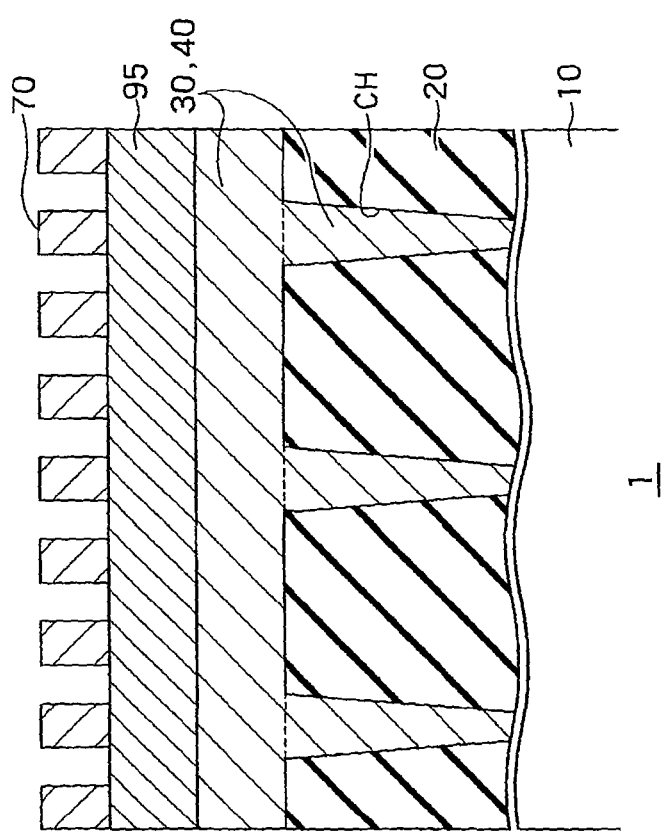

A sacrifice film 95 is then deposited on the material of the first wiring parts 40 as shown in FIGS. 15A and 15B. The sacrifice film 95 is formed using, for example, amorphous silicon or a silicon nitride film. The hard mask 70 is further formed on the sacrifice film 95. The formation method of the hard mask 70 can be identical to that in the first embodiment.

Figure 16A:
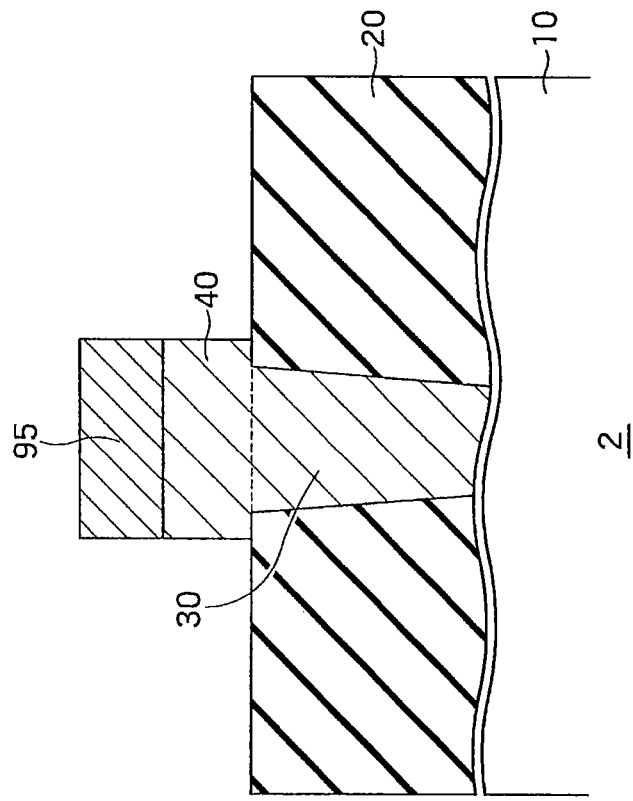
Figure 16B:
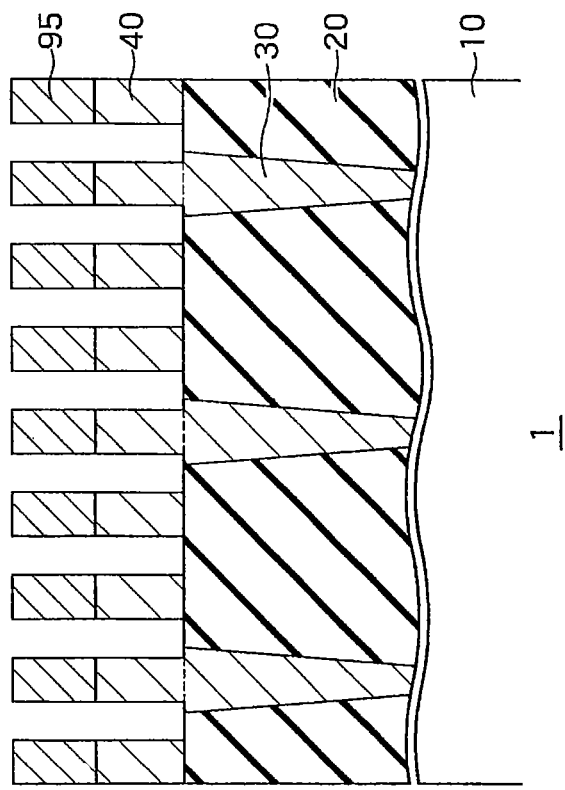

The sacrifice film 95 and the material of the first wiring parts 40 are then processed by the RIE method using the hard mask 70 as a mask as shown in FIGS. 16A and 16B. The sacrifice film 95 and the material of the first wiring parts 40 are etched until the upper surface of the interlayer dielectric film 20 is exposed. Adjacent portions of the sacrifice film 95 are electrically separated from each other. Adjacent ones of the first wiring parts 40 are also electrically separated from each other.

Figure 17A:
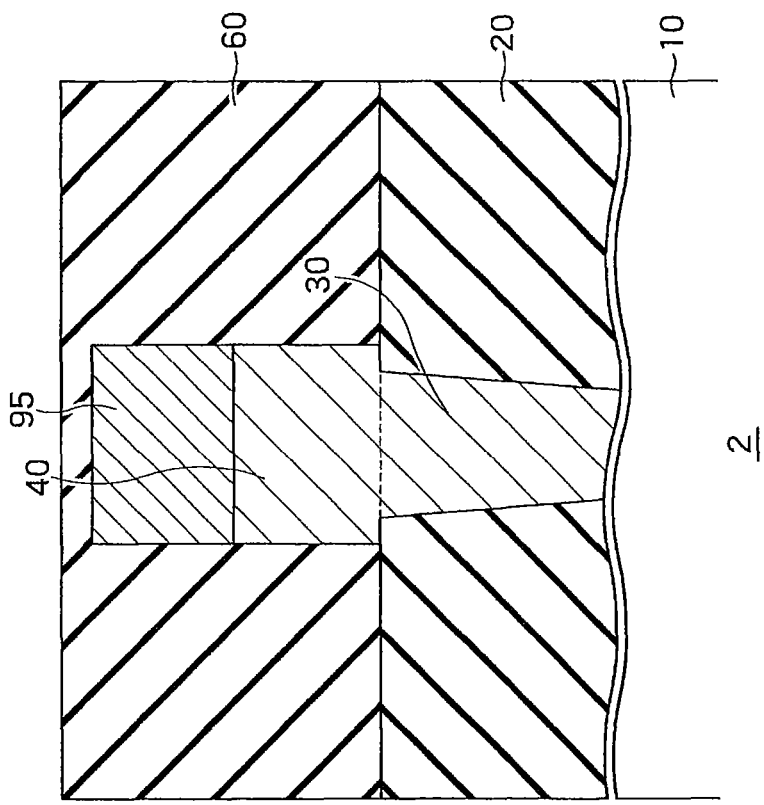
Figure 17B:
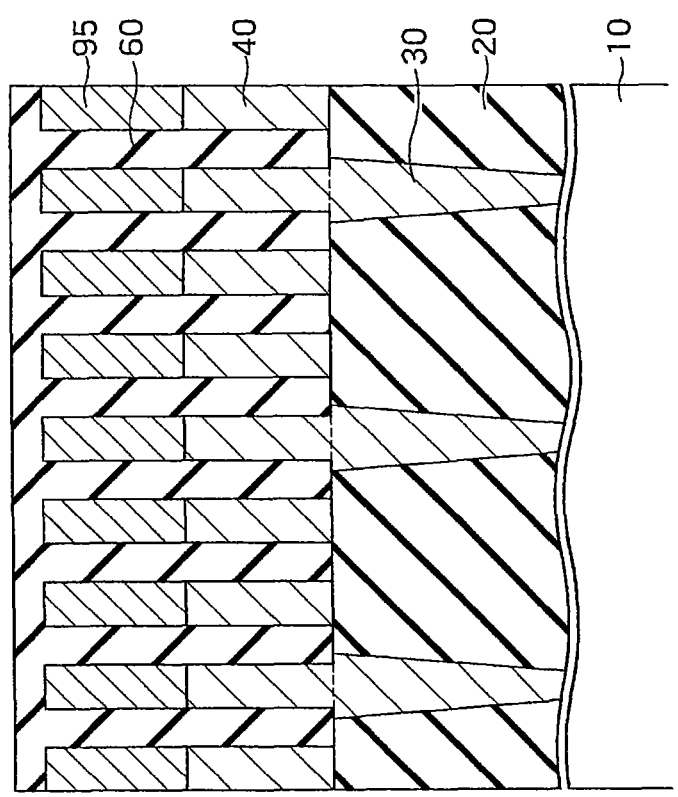

The material of the interlayer dielectric film 60 is then deposited to cover the sacrifice film 95 and the first wiring parts 40 as shown in FIGS. 17A and 17B. The interlayer dielectric film 60 is thereby filled between adjacent portions of the sacrifice film 95 and between adjacent ones of the first wiring parts 40 as shown in FIG. 17A. The material of the interlayer dielectric film 60 can be identical to that in the first embodiment.

The interlayer dielectric film 60 is then polished using the CMP method until the upper surface of the sacrifice film 95 is exposed. In this way, a structure shown in FIGS. 18A and 18B is obtained.

The sacrifice film 95 is then removed as shown in FIGS. 19A and 19B. Accordingly, trenches 101 surrounded by the side surfaces of the interlayer dielectric film 60 and the upper surfaces of the first wiring parts 40 are formed. The trenches 101 have a width (a width in a cross-section in an orthogonal direction to the longitudinal direction of the trenches 101) substantially equal to the width (W1 or W2) of the first wiring parts 40.

The barrier film 90 is then deposited on the inner surfaces of the trenches 101. The barrier film 90 is formed using, for example, titanium, tantalum, or TaN.

The material of the second wiring parts 50 is then embedded in the trenches 101 using the sputtering method or the electrolytic plating method as shown in FIGS. 14A and 14B. The material of the second wiring parts 50 is polished by the CMP method or the like, thereby forming the second wiring parts 50. The second wiring parts 50 have a width substantially equal to that of the first wiring parts 40. An annealing process is then performed.

An interlayer dielectric film, contact plugs, wirings, and the like (not shown) are then formed on the second wiring parts 50, whereby the memory according to the third embodiment is completed.

According to the third embodiment, the trenches 101 are formed on the first wiring parts 40 by using the sacrifice film 95. Therefore, during formation of the second wiring parts 50, there is no need to use the electroless plating method and the sputtering method or the electrolytic plating method can be used. That is, the material of the second wiring parts 50 is not required to be displaced with the material of the first wiring parts 40 and it suffices to deposit the material of the second wiring parts 50 selectively and additionally on the upper surfaces of the first wiring parts 40. Therefore, the barrier film 90 can be formed around the second wiring parts 50. Furthermore, the third embodiment can achieve effects identical to those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   first wiring parts located above a substrate and made of a first metal material; and
   second wiring parts superimposed on the first wiring parts and having a width equal to that of the first wiring parts, the width being length in a horizontal direction in a cross-section perpendicular to a longitudinal direction of the first or second wiring part, wherein
   a first sheet resistance of the first wiring parts is lower than a second sheet resistance of the second wiring parts, in a first region on the substrate in which the first and second wiring parts have a first width,
   the second sheet resistance is lower than the first sheet resistance, in a second region on the substrate in which the first and second wiring parts have a second width larger than the first width,
   the first wiring parts in the first and second regions are in a same layer and include a same material,
   the second wiring parts in the first and second regions are in a same layer and include a same material,
   the first wiring parts have tungsten or molybdenum,
   the second wiring parts have any of copper, silver, platinum, or gold,
   the first region is a memory area including wirings with the first width,
   the second region is a peripheral circuit area including wirings with the second width, and
   the first and second wiring parts extend in directions parallel to a surface of the substrate.

2. The device of claim 1, wherein the second wiring parts have a second metal material with a lower ionization tendency than the first metal material.

3. The device of claim 1, further comprising a manganese oxide film on an upper surface or side surfaces of the second wiring parts.

4. The device of claim 1, further comprising a barrier film on a bottom surface or side surfaces of the second wiring parts.

5. A semiconductor device comprising:
   first wiring parts located above a substrate and made of a first metal material; and
   second wiring parts superimposed on the first wiring parts and having a width equal to that of the first wiring parts, the width being length in a horizontal direction in a cross-section perpendicular to a longitudinal direction of the first or second wiring part, wherein
   a first sheet resistance of the first wiring parts is lower than a second sheet resistance of the second wiring parts, in a first region on the substrate in which the first and second wiring parts have a first width,
   the second sheet resistance is lower than the first sheet resistance, in a second region on the substrate in which the first and second wiring parts have a second width larger than the first width,
   the first wiring parts in the first and second regions are in a same layer and include a same material,
   the second wiring parts in the first and second regions are in a same layer and include a same material,
   the first wiring parts have tungsten or molybdenum,
   the second wiring parts have any of copper, silver, platinum, or gold,
   the first and second wiring parts in the first region are in a memory area and provide bit lines, and
   the first and second wiring parts in the second region are in a peripheral area and provide wirings in the peripheral area.

6. The device of claim 5, wherein the second wiring parts have a second metal material with a lower ionization tendency than the first metal material.

7. The device of claim 5, wherein
   the first and second wiring parts extend in directions parallel to a surface of the substrate.

8. The device of claim 5, further comprising a manganese oxide film on an upper surface or side surfaces of the second wiring parts.

9. The device of claim 5, further comprising a barrier film on a bottom surface or side surfaces of the second wiring parts.

* * * * *